United States Patent
Kelso et al.

(10) Patent No.: US 10,472,735 B2
(45) Date of Patent: Nov. 12, 2019

(54) METHOD OF MAKING A SINGLE CRYSTAL WAVELENGTH CONVERSION ELEMENT, SINGLE CRYSTAL WAVELENGTH CONVERSION ELEMENT, AND LIGHT SOURCE CONTAINING SAME

(71) Applicant: OSRAM Opto Semiconductors GmbH, Regensburg (DE)

(72) Inventors: John Kelso, Exeter, NH (US); Alan Piquette, Peabody, MA (US); David Johnston, Kensington, NH (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/572,486

(22) PCT Filed: Apr. 28, 2016

(86) PCT No.: PCT/US2016/029896
§ 371 (c)(1),
(2) Date: Nov. 7, 2017

(87) PCT Pub. No.: WO2016/182758
PCT Pub. Date: Nov. 17, 2016

(65) Prior Publication Data
US 2018/0171508 A1 Jun. 21, 2018

Related U.S. Application Data

(60) Provisional application No. 62/159,476, filed on May 11, 2015.

(51) Int. Cl.
*H01L 33/50* (2010.01)
*C30B 29/28* (2006.01)
(Continued)

(52) U.S. Cl.
CPC .............. *C30B 29/28* (2013.01); *C04B 35/16* (2013.01); *C04B 35/44* (2013.01); *C04B 35/581* (2013.01);
(Continued)

(58) Field of Classification Search
CPC .............................. C30B 29/28; H01L 33/502
See application file for complete search history.

(56) References Cited

U.S. PATENT DOCUMENTS 9,499,923 B2    11/2016    Houzvicka
2008/0298407 A1    12/2008    Ikesue

FOREIGN PATENT DOCUMENTS

CN    103 820 859 A    5/2014
CN    102 409 391 B    1/2015
(Continued)

OTHER PUBLICATIONS

PCT Search Report and Written Opinion in counterpart appln. PCT/US2016/029896 dated Oct. 26, 2016 (22 pgs).
(Continued)

*Primary Examiner* — Douglas M Menz
(74) *Attorney, Agent, or Firm* — Slater Matsil, LLP

(57) ABSTRACT

There is herein described a method of making a single crystal wavelength conversion element from a polycrystalline wavelength conversion element, a single crystal wavelength conversion element, and a light source containing same. By making the single crystal wavelength conversion element from a polycrystalline wavelength conversion element, the method provides greater flexibility in creating single crystal wavelength conversion elements as compared to melt grown methods for forming single crystals. Advantages may include higher activator contents, forming more
(Continued)

complex shapes without machining, providing a wider range of possible activator gradients and higher growth rates at lower temperatures.

13 Claims, 4 Drawing Sheets

(51) Int. Cl.
| | |
|---|---|
| *C04B 35/44* | (2006.01) |
| *C04B 35/64* | (2006.01) |
| *C09K 11/77* | (2006.01) |
| *C30B 1/02* | (2006.01) |
| *C30B 29/34* | (2006.01) |
| *C30B 29/38* | (2006.01) |
| *C30B 29/40* | (2006.01) |
| *C04B 35/16* | (2006.01) |
| *C04B 35/581* | (2006.01) |
| *C04B 35/584* | (2006.01) |
| *C04B 35/587* | (2006.01) |
| *C04B 35/597* | (2006.01) |

(52) U.S. Cl.
CPC .......... *C04B 35/584* (2013.01); *C04B 35/587* (2013.01); *C04B 35/597* (2013.01); *C04B 35/64* (2013.01); *C09K 11/7721* (2013.01); *C09K 11/7774* (2013.01); *C30B 1/02* (2013.01); *C30B 29/34* (2013.01); *C30B 29/38* (2013.01); *C30B 29/406* (2013.01); *H01L 33/502* (2013.01); *C04B 2235/3203* (2013.01); *C04B 2235/3206* (2013.01); *C04B 2235/3208* (2013.01); *C04B 2235/3213* (2013.01); *C04B 2235/3215* (2013.01); *C04B 2235/3224* (2013.01); *C04B 2235/3225* (2013.01); *C04B 2235/3229* (2013.01); *C04B 2235/3418* (2013.01); *C04B 2235/604* (2013.01); *C04B 2235/6021* (2013.01); *C04B 2235/6022* (2013.01); *C04B 2235/6025* (2013.01); *C04B 2235/6027* (2013.01); *C04B 2235/6582* (2013.01); *C04B 2235/764* (2013.01); *H01L 2933/0041* (2013.01)

(56) References Cited

FOREIGN PATENT DOCUMENTS

| | | |
|---|---|---|
| JP | 2003 267797 A | 9/2003 |
| WO | 2012106282 A1 | 8/2012 |

OTHER PUBLICATIONS

Hansel, Rachel et al., "Temperature-Dependent Luminescence of Gallium-Substituted YAG:Ce", J. Mat. Sci. (2010, Kluwer Academic Pub.), vol. 45, No. 1, pp. 146-150 (pub. on-line Sep. 30, 2009).

Abstract (in English) of CN 103 820 859 obtained from public database espacenet, Jun. 19, 2017, 1 pg.

Abstract (in English) of CN 102 409 391 obtained from public database espacenet, Jun. 19, 2017, 1 pg.

Abstract (in English) of JP 2003 267797 obtained from EPO public database, 1 page.

Excerpt from Ikesue, Aung, & Lupei, Ceramic Lasers, Chapter 7.3 "Single crystal ceramics produced by sintering" pp. 255-265 (Cambridge Univ. Press, 2013), 12 pgs.

Application Note "Cryphosphor (TM) Monocrystalline Luminophor for High-power LEDs", undated, published on website prior to priority application filed herein by company CRYTUR, spol. s r.o. (Palackecho 175, Turnov, Czech Rep. having website address www.crytur.com), 4 pgs. (color).

A. Ikesue, et al., "Fabrication and Laser Performance of Polycrystal and Single Crystal Nd:YAG by Advanced Ceramic Processing", Optical Materials 29 (2007) pp. 1289-1294, 6 pgs (color).

A. Ikesue, et al., "Optical Quality and Laser Performance of Polycrystal and Single Crystal Nd: YAG by Sintering Method", Proc. of SPIE, vol. 5991 (2005), pp. 599122-1 to 599122-9, 9 pgs (color).

METHOD OF MAKING A SINGLE CRYSTAL WAVELENGTH CONVERSION ELEMENT, SINGLE CRYSTAL WAVELENGTH CONVERSION ELEMENT, AND LIGHT SOURCE CONTAINING SAME

CROSS REFERENCES TO RELATED APPLICATIONS

The present application is a national stage application of, and claims priority of, an international application No. PCT/US2016/029896, filed Apr. 28, 2016, that claims the benefit of U.S. Provisional Application No. 62/159,476, filed May 11, 2015, the entire contents of which are herein incorporated by reference.

BACKGROUND

Optical elements for high efficiency conversion of the monochromatic light emitted by light emitting diodes (LEDs) or lasers may be comprised of photoluminescent materials, such as inorganic phosphors, that at least partially convert the primary light emitted by these devices into a longer wavelength secondary light which can be used to achieve a different single color emission or a white light. A preferred conversion material is cerium-activated yttrium aluminum garnet (YAG:Ce) which is used in combination with a blue-emitting LED to generate white light. In some applications, conversion is achieved with conversion elements comprised of polycrystalline ceramics or single crystal materials. Such solid ceramic converters are preferred for high power applications because of their ability to better dissipate the heat generated by the conversion process. Polycrystalline materials are more preferred because single crystals are generally more expensive and limited in their applicability.

More particularly, single crystals are generally grown by slowly pulling a seeded crystal from a melted liquid with techniques such as the Czochralski (CZ) method. Unfortunately, such growth methods limit the concentration of activator ions that can be incorporated in the host lattice because of (1) the ionic size mismatch between the activator ions and the host lattice ions, and (2) the segregation coefficients of the activator ions. This consequently leads to an upper limit of about 0.33% Ce substitution for Y or Lu in garnet-based phosphors such as YAG:Ce or cerium-activated lutetium aluminum garnet (LuAG:Ce.) CZ grown crystals are also subject to optically heterogeneous structures such as cores, facets around the outer region, and striations which makes them less suitable for certain applications.

Some applications of optical single crystals may also benefit from a concentration gradient of activator ions which is difficult to generate in melt grown crystals. Gradients might be introduced by diffusion but this limits the location of the gradients (e.g., only higher outside where the dopant can be applied for diffusion). Furthermore, single crystals pulled from a melt are generally cylindrical in shape and need extensive machining to make desired shapes and physical features.

In sum, current melt-grown single crystals have limited activator contents, limited placements for activator concentration gradients, limited as-grown shapes, slow melt processing, and optical heterogeneities.

SUMMARY OF THE INVENTION

It is an object of the invention to obviate the disadvantages of the prior art.

It is another object of the invention to provide a method of making a single crystal wavelength conversion element that offers greater flexibility in forming single crystal wavelength conversion elements.

It is a further object of the invention to provide a single crystal wavelength conversion element and a light source containing same.

In accordance with an object of the invention, there is provided a method of making a single crystal wavelength conversion element comprising the steps of:

(a) obtaining a polycrystalline wavelength conversion element optionally containing a grain growth promoter;

(b) attaching a seed crystal to a surface of the polycrystalline wavelength conversion element wherein the seed crystal is attached by use of the grain growth promoter at least when the polycrystalline wavelength conversion element does not contain the grain growth promoter; and (c) sintering the polycrystalline wavelength conversion element at a temperature and for a time sufficient to form the single crystal wavelength conversion element.

In accordance with another object of the invention, there is provided a single crystal wavelength conversion element comprising a single crystal of a phosphor selected from:

(a) $(A_{1-x}Ce_x)_3B_5O_{12}$, wherein A is at least one of Y, Sc, La, Gd, Lu, and Tb, B is at least one of Al, Ga and Sc, and $0.005 \leq x \leq 0.1$;

(b) $(A_{1-x}Ce_x)_3(Al_{5-2y}Mg_ySi_y)O_{12}$ wherein A is at least one of Y, Lu, Tb, and Gd, $0.005 \leq x \leq 0.1$, and $0 < y \leq 2$;

(c) $(A_{1-x}Ce_x)_3Al_{5-y}Si_yO_{12-y}N_y$ wherein A is at least one of Y, Lu, Tb, and Gd, $0.005 \leq x \leq 0.1$, and $0 < y \leq 0.5$;

(d) $(A_{1-x}Ce_x)_2CaMg_2Si_3O_{12}$ wherein A is at least one of Y, Lu, Tb, and Gd, and $0 < x \leq 0.1$;

(e) $(AE_{1-x}Eu_x)_2Si_5N_8$ wherein AE is at least one of Ca, Sr, and Ba and $0 < x \leq 0.1$;

(f) $(AE_{1-x}Eu_x)AlSiN_3$ wherein AE is at least one of Ca, Sr, and Ba and $0 < x \leq 0.1$;

(g) $(AE_{1-x}Eu_x)_3Ga_3N_5$ wherein AE is at least one of Ca, Sr, and Ba and $0 < x \leq 0.1$;

(h) $(AE_{1-x}Eu_x)Si_2O_2N_2$ wherein AE is at least one of Ca, Sr, and Ba and $0 < x \leq 0.1$;

(i) $(AE_xEu_y)Si_{12-2x-3y}Al_{2x+3y}O_yN_{16-y}$ wherein AE is at least one of Ca, Sr, and Ba, $0.2 < x \leq 2.2$ and $0 < y \leq 0.1$;

(j) $(AE_{1-x}Eu_x)_2SiO_4$ wherein AE is at least one of Ca, Sr, and Ba and $0 < x \leq 0.1$; and (k) $(AE_{1-x}Eu_x)_3SiO_5$ wherein AE is at least one of Ca, Sr, and Ba and $0 < x \leq 0.1$.

In accordance with a further object of the invention, there is provided a light source comprising a light emitting diode (LED) that emits a primary light and a single crystal wavelength conversion element that converts at least a portion of the primary light to a secondary light.

DETAILED DESCRIPTION OF THE INVENTION

Figure 1:
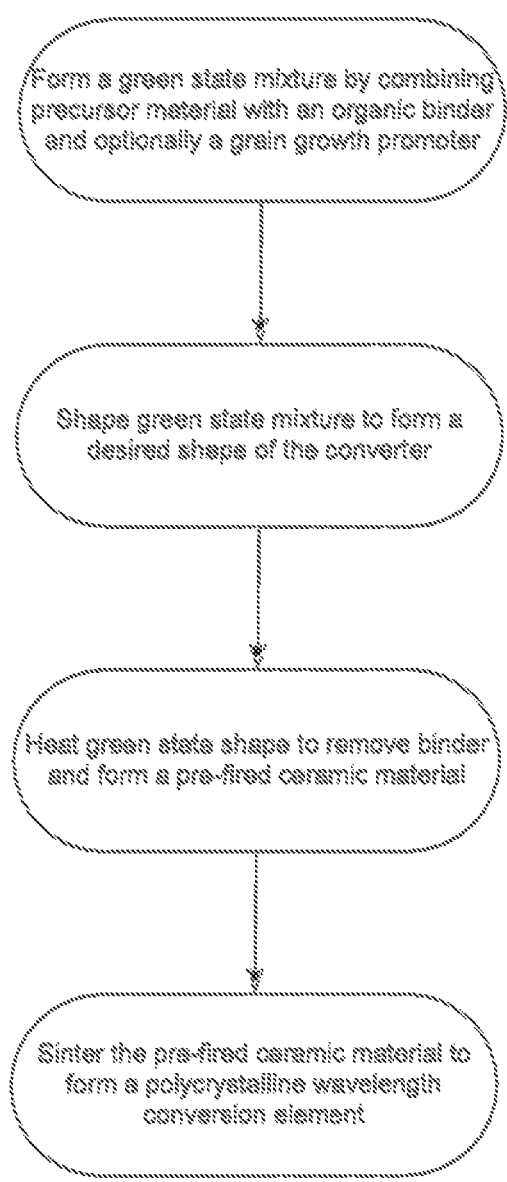
FIG. 1 is a schematic illustration of a method of forming a polycrystalline wavelength conversion element.

For a better understanding of the present invention, together with other and further objects, advantages and capabilities thereof, reference is made to the following disclosure and appended claims taken in conjunction with the above-described drawings.

References to the color of a phosphor, LED, laser or conversion material refer generally to its emission color unless otherwise specified. Thus, a blue LED emits a blue light, a yellow phosphor emits a yellow light and so on.

As used herein, a "single crystal wavelength conversion element" means a crystalline photoluminescent ceramic material that has a generally continuous crystal lattice, with substantially no grain boundaries, throughout the conversion element. Some defects and grain boundaries are contemplated to exist within the single crystal wavelength conversion element provided such imperfections do not substantially interfere with the properties of the conversion element to behave as a single crystal. This may be contrasted with a polycrystalline wavelength conversion element (PCWCE) which is comprised of a photoluminescent ceramic material that has numerous grains (crystallites) of varying size and orientation throughout the conversion element.

The present invention offers more flexibility in the crystal attributes (higher activator content, better concentration gradient control, better optical homogeneity, better single crystal shape control) and a lower cost process over melt-grown crystals. In particular, it is expected that activator concentrations may be increased by nearly an order of magnitude. For example, in garnet-based phosphors, the concentration of Ce may be increased from a 0.33% molar substitution of Ce ions for Y or Lu ions in YAG or LuAG single crystals to at least a 4-5% Ce substitution. This increase is achieved by first forming a polycrystalline wavelength conversion element (PCWCE) having the desired higher activator concentration and then converting the PCWCE into a single crystal. Because the conversion element was first formed as a polycrystalline ceramic, it is possible to incorporate a higher activator concentration into the host lattice.

Single crystals grown from polycrystalline ceramics may be fabricated in a wide variety of shapes because of the flexibility in the methods by which polycrystalline ceramics are made. In particular, shapes such as domes and platelets with holes, notches, surface texture or other features can be molded easily in the green (unfired) state ceramics which are sintered to form a polycrystalline ceramic and then converted to single crystals. Such shapes and features would involve a significant amount of expensive machining time and material losses if they had to be machined from a single crystal boule drawn from a melt.

It is also simpler to form a polycrystalline ceramic with a concentration gradient, e.g., by laminating layers with different activator concentrations. Once formed, the polycrystalline ceramic having the activator gradient may then be converted into a single crystal containing the desired activator gradient. This method therefore allows for the formation of concentration gradients or refractive index gradients that cannot be achieved by melt growth methods (e.g., low-high-low gradients through the thickness of a slab or radially across a cylinder).

Another advantage of the method of the present invention is the high crystal growth rates that may be achieved at lower temperatures when starting with a polycrystalline ceramic. In particular, single crystals made by melt grown methods must be pulled slowly from the melt at temperatures above the melting temperature of the material and thus only a growth rate of about 0.2 mm/hr may be achieved whereas in polycrystalline ceramics that growth rate may be up to several mm/hr at several hundred degrees below the melting temperature of the material. This combination of accelerated crystal growth rate and lower processing temperatures can lead to significant cost savings. In addition, by converting polycrystalline wavelength conversion elements into single crystals, one should be better able to grind the conversion element into a thin ceramic layer (e.g., 10-30 μm) which is something that is difficult to achieve with a PCWCE as polycrystalline ceramics tend to fracture due to crack induced damage from the grinding process.

In one embodiment, the single crystal wavelength conversion element is comprised of a garnet-based phosphor which may be represented by the general formula $(A_{1-x}Ce_x)_3B_5O_{12}$, wherein A is at least one of Y, Sc, La, Gd, Lu, and Tb, B is at least one of Al, Ga and Sc, and wherein x is preferably from 0.005 to 0.1, more preferably from 0.005 to 0.05 and even more preferably from 0.005 to 0.02. In a preferred embodiment, A is at least one of Y, Gd, Lu and Tb and B is Al. More preferably, the phosphor is one of $(Y_{1-x}Ce_x)_3Al_5O_{12}$ or $(Lu_{1-x}Ce_x)_3Al_5O_{12}$, wherein x is from 0.005 to 0.05, and preferably from 0.005 to 0.02. Further examples of phosphors that may be used in the present invention include:

(a) $(A_{1-x}Ce_x)_3(Al_{5-2y}Mg_ySi_y)O_{12}$ wherein A is at least one of Y, Lu, Tb, and Gd, $0.005 \leq x \leq 0.1$, and $0 < y \leq 2$;

(b) $(A_{1-x}Ce_x)_3Al_{5-y}Si_yO_{12-y}N_y$ wherein A is at least one of Y, Lu, Tb, and Gd, $0.005 \leq x \leq 0.1$, and $0 < y \leq 0.5$;

(c) $(A_{1-x}Ce_x)_2CaMg_2Si_3O_{12}$ wherein A is at least one of Y, Lu, Tb, and Gd, and $0 < x \leq 0.1$, (d) $(AE_{1-x}Eu_x)_2Si_5N_8$ wherein AE is at least one of Ca, Sr, and Ba and $0 < x \leq 0.1$;

(e) $(AE_{1-x}Eu_x)AlSiN_3$ wherein AE is at least one of Ca, Sr, and Ba and $0 < x \leq 0.1$;

(f) $(AE_{1-x}Eu_x)_3Ga_3N_5$ wherein AE is at least one of Ca, Sr, and Ba and $0 < x \leq 0.1$;

(g) $(AE_{1-x}Eu_x)Si_2O_2N_2$ wherein AE is at least one of Ca, Sr, and Ba and $0 < x \leq 0.1$;

(h) $(AE_xEu_y)Si_{12-2x-3y}Al_{2x+3y}O_yN_{16-y}$ wherein AE is at least one of Ca, Sr, and Ba, $0.2 < x \leq 2.2$ and $0 < y \leq 0.1$;

(i) $(AE_{1-x}Eu_x)_2SiO_4$ wherein AE is at least one of Ca, Sr, and Ba and $0 < x \leq 0.1$;

(j) $(AE_{1-x}Eu_x)_3SiO_5$ wherein AE is at least one of Ca, Sr, and Ba and $0 < x \leq 0.1$;

(k) $(AE_{1-x}Eu_x)LiAl_3N_4$ wherein AE is at least one of Ca, Sr, and Ba and $0 < x \leq 0.1$; and (l) $(AE_{1-x}Eu_x)Mg_3SiN_4$ wherein AE is at least one of Ca, Sr, and Ba and $0 < x \leq 0.1$.

A method of making a polycrystalline wavelength conversion element is shown in FIG. 1. The method includes the steps of: (a) combining a precursor material with an organic binder material and optionally a grain growth promoter to form a green state mixture, (b) shaping the green state mixture to form a green state shape of the wavelength conversion element, such as a plate or dome; (c) heating the green state shape to remove the binder and form a pre-fired ceramic material; and (d) sintering the pre-fired ceramic material to form a polycrystalline ceramic wavelength conversion element having the desired shape. Preferably, the heating in step (c) may be performed at a temperature up to 1150° C. The pre-fired ceramic material is preferably sintered at 1500° C.-1825° C. More preferably, the pre-fired ceramic material is sintered in a wet hydrogen or wet hydrogen-nitrogen atmosphere (−10° C. to 15° C. dewpoint).

Preferably, the precursor material is an inorganic luminescent material such as one of the phosphors described above. More preferably, the precursor material comprises a garnet-based phosphor such as cerium-activated yttrium aluminum garnet (YAG:Ce) or cerium-activated lutetium aluminum garnet (LuAG:Ce) and the grain growth promoter is $SiO_2$. In an alternate method, the green state mixture may contain more than one precursor materials and heating of the green state shape causes the precursor materials to react to form a luminescent ceramic material. For example, the green state mixture may comprise a mixture of oxides formulated to produce the desired luminescent ceramic, such as a mixture of $Y_2O_3$, $Al_2O_3$ and $CeO_2$. Methods for forming the green state shape include injection molding, tape casting, dry pressing, slip casting, or extrusion.

Figure 2:
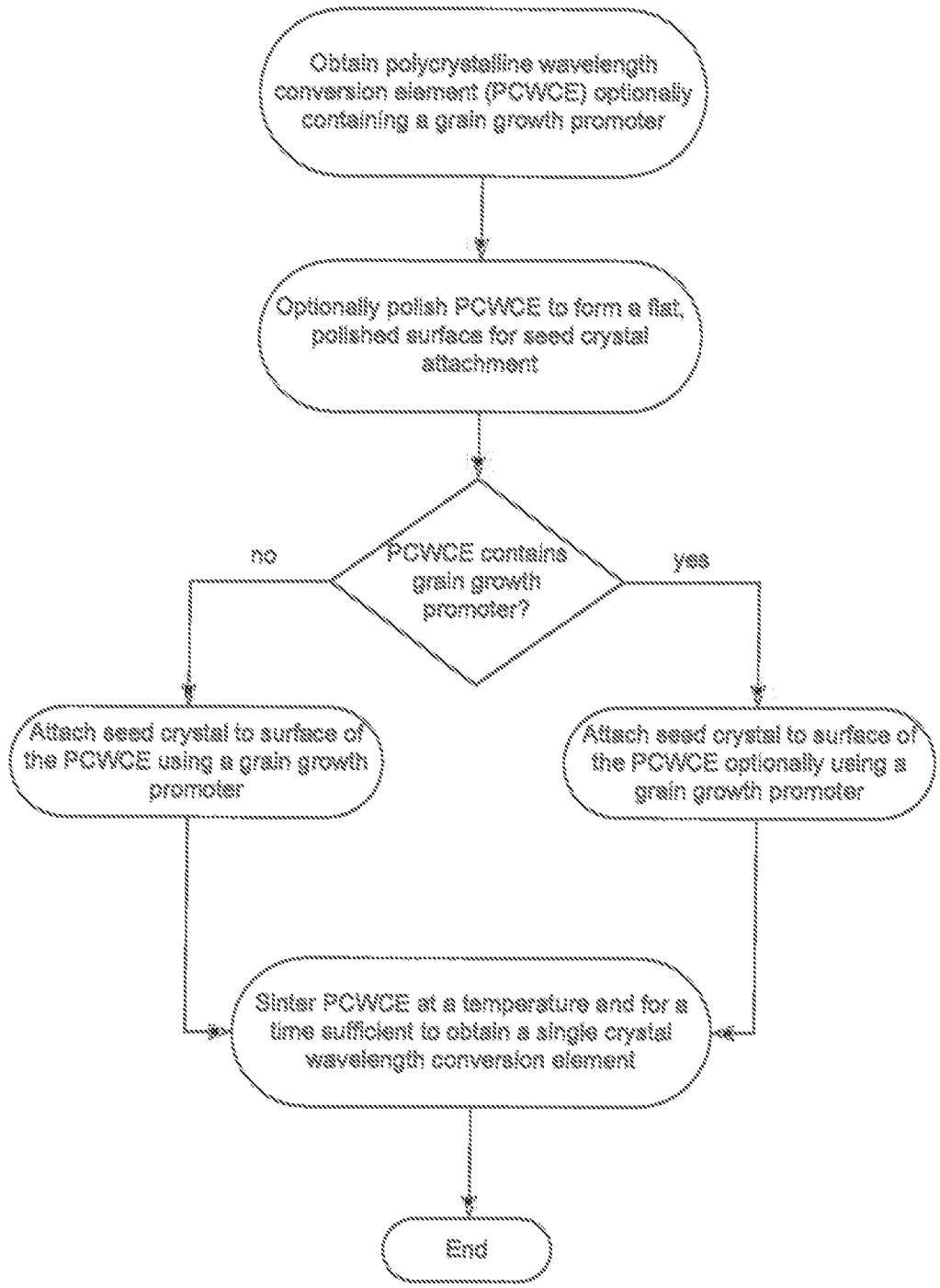
FIG. 2 is a schematic illustration of a method of forming a single crystal wavelength conversion element.

In a preferred method shown in FIG. 2, a single crystal wavelength conversion element may be made from the polycrystalline wavelength conversion element (PCWCE) by the steps of: (a) attaching a seed crystal to the polycrystalline wavelength conversion element and (b) heating the polycrystalline wavelength conversion element at a temperature and for a time sufficient to convert the polycrystalline wavelength conversion element to a single crystal. As shown in FIG. 2, if the PCWCE does not contain the grain growth promoter, then the grain growth promoter is used to attach the seed crystal to the PCWCE. The grain growth promoter may also be used for attaching the seed crystal even if the grain growth promoter is already present in the PCWCE. The grain growth promoter (e.g., $SiO_2$) forms a liquid phase at elevated temperature which accelerates the grain growth rate. For garnet-based conversion elements such as YAG:Ce and LuAG:Ce the bonded PCWCE/seed crystal is heated to a temperature from 1700-1850° C. for preferably one to 48 hours.

Preferably, the surface of the polycrystalline wavelength conversion element where the seed crystal is attached has been polished smooth and flat. More preferably, the seed crystal has also been polished smooth and flat to promote an intimate contact between the seed crystal and PCWCE. It is believed that the thermodynamics drives the single crystal grain growth as long as the surface energy of the seed crystal is much less than that of the fine grains in the polycrystalline ceramic. This condition is quite accessible as the radius of curvature of the single crystal is typically much larger than that of the grains in the polycrystalline ceramic provided the ceramic grain size remains less than several microns. In particular, the seed crystal should be significantly larger (>1-2 orders of magnitude) larger than the grain size of the PCWCE. The seed crystal is preferably CZ grown, cut from the boule, and polished very flat.

Figure 3:
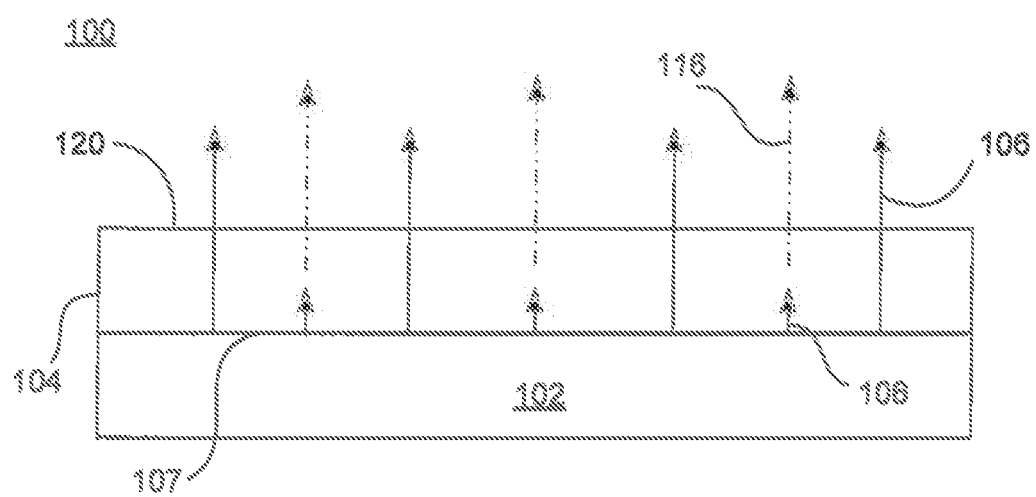
FIG. 3 is a cross-sectional illustration of a first embodiment of an LED light source having a single crystal wavelength conversion element according to this invention.

FIG. 3 illustrates the use of a single crystal wavelength conversion element in a phosphor-converted LED (pc-LED) configuration. In particular, a light source 100 in the form of a pc-LED having a single crystal wavelength conversion element 104 is shown. The single crystal wavelength conversion element is comprised of a single crystal phosphor material, for example, a luminescent cerium-activated yttrium aluminum garnet, $Y_3Al_5O_{12}$:Ce. The wavelength conversion element 104 generally has a thickness of between 20 µm and 500 µm and preferably between 100 µm and 250 µm. In a preferred embodiment, the wavelength conversion element has the shape of a flat plate, although it is not limited to such.

Primary light 106 emitted from light-emitting surface 107 of the blue-emitting LED die 102 passes into wavelength conversion element 104 which converts at least a portion of the blue light into a secondary light 116 having a different peak wavelength, e.g., a yellow light. The color of the light eventually emitted from the light-emitting surface 120 of conversion element 104 will depend on the ratio of the amount of unconverted primary light 106 that passes through the wavelength conversion element to the amount of primary light that is converted to secondary light 116 within the conversion element. In some applications, all of the primary light 106 is absorbed and only converted light 116 is emitted (full conversion.)

Figure 4:
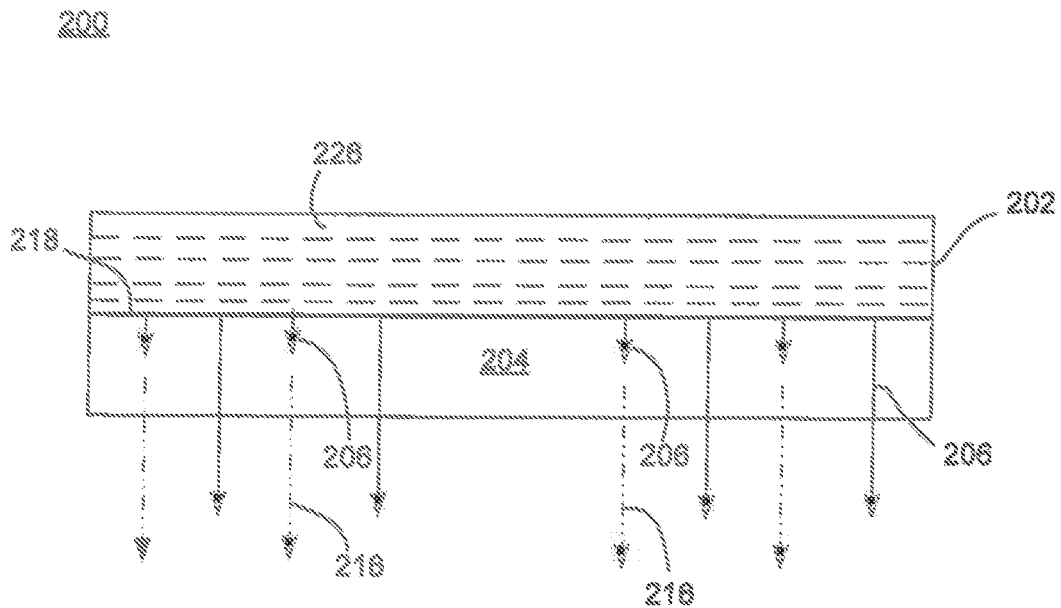
FIG. 4 is a cross-sectional illustration of a second embodiment of an LED light source having a single crystal wavelength conversion element according to this invention.
Figure 5:
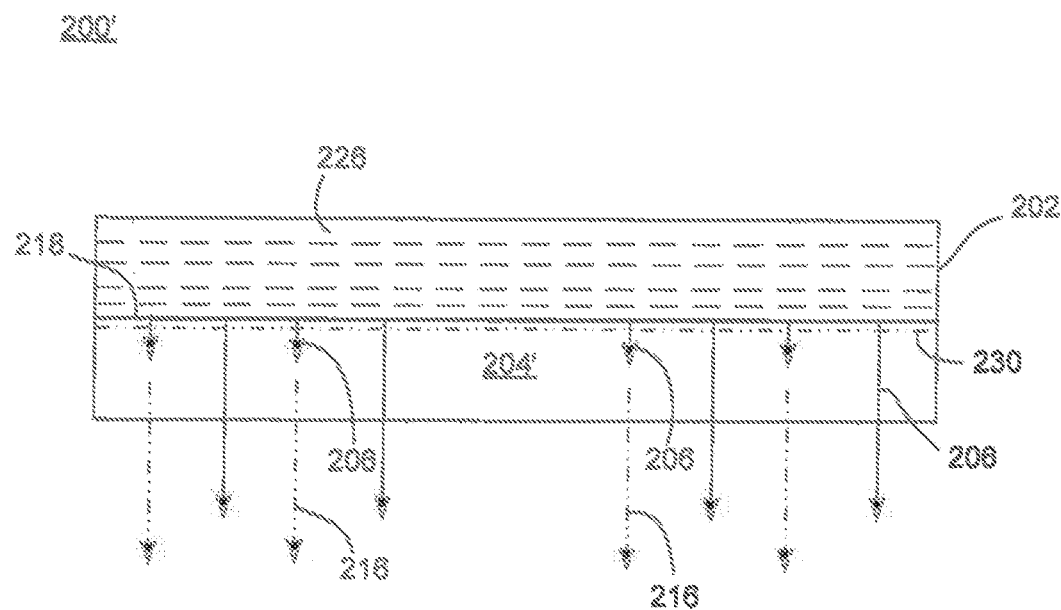
FIG. 5 is a cross-sectional illustration of a third embodiment of an LED light source having a single crystal wavelength conversion element according to this invention.

By converting polycrystalline ceramics into single crystals with a preferred orientation (from the seed crystal), it may be possible to grow the LED GaN or InGaN epitaxial layers directly on the wavelength conversion element. Referring to FIG. 4, a light source 200 is illustrated having a similar configuration to the pc-LED shown in FIG. 3 except that the LED 202 has been grown on the surface of the single crystal wavelength conversion element 204. In particular, the LED 202 is comprised of a plurality of epitaxially grown layers 226 on oriented crystal surface 218. Preferably, the LED 202 comprises a plurality of GaN/InGaN layers and emits a blue primary light in a range from about 420 nm to about 490 nm. Similar to FIG. 3, primary light 206 is emitted from the LED 202 and passes into conversion element 204 where it is at least partially converted to secondary light 216. (The different device orientations shown in FIGS. 3-5 are provided merely for ease of illustration and should not be construed as a limitation on the invention.) In a preferred embodiment, it is desirable to make a single crystal YAG:Ce conversion element with a (111) orientation parallel to the surface as a substrate to grow GaN/InGaN LED upon. Using the wavelength conversion element as the substrate for the epitaxial layers also eliminates and the requirement for drawn, cut and polished sapphire as a growth substrate thereby lowering costs.

In cases where the single crystal will serve as a substrate for epitaxial growth, the crystal structure should be evaluated to determine any mismatch between axes in the unit cell that present a hexagonal in-plane array and the a-b lattice parameters of GaN/InGaN. Moderate mismatch discrepancies can be addressed by a strain relief superlattice between the single crystal wavelength conversion element and the GaN/InGaN. Additionally, using a single crystal substrate made from a PCWCE as a substrate for epitaxial growth has advantages that cannot be met with traditional single crystals. For example, as discussed above, the method of this invention allows the single crystal wavelength conversion element to be initially constructed from thin laminated ceramic layers. This technique may be used to modify the surface layer of the conversion element on which the epitaxial growth occurs. In particular, it may be possible by adding or removing activator ions from the surface layer to fine tune the crystal lattice in a way to decrease the mismatch between single crystal substrate and growth layer resulting in decreased dislocations in the epitaxial growth layer. For instance, in YAG the lattice dimension difference between doped and non-doped YAG is in the range of 0.02%. Such an embodiment is illustrated in FIG. 5 which shows a light source 200' that is similar to light source 200 of FIG. 4. In this case however the single crystal wavelength conversion element 204' has a surface layer 230 in which the crystal lattice has been adjusted to reduce lattice mismatch between the conversion element 204' and the epitaxially grown layers 226 on oriented crystal surface 218.

In addition, a laminate layer upon which the epitaxial layer is grown could be of a different chemistry, but same space group. For example: a laminated polycrystalline LuAG phosphor converter could have a top layer of YAG (undoped=no light output) as thin as a few microns, which is converted to (1 1 1) single crystal. This would result in a shift in the a-b lattice parameter of ~0.9% reducing mismatch and associated dislocations in the epitaxial growth layer. For less of a change, the undoped YAG layer could be shuffled to a lower position in the laminate stack.

In another embodiment, the process for forming the single crystal involves stamping a faceted face in a green-state ceramic, sintering to form a polycrystalline material, converting the polycrystalline material to single crystal, and growing GaN/InGaN epitaxial layer(s) on the faceted face. If the optical axis deviates from the average normal on each of the facets, this will create an LED with higher extraction efficiency and a broader emission cone. Alternately the GaN/InGaN layers could be grown on a flat side of the single crystal wavelength conversion element which has facets on the emitting side.

In yet another embodiment, the process may involve fashioning a green-state ceramic dome or dome array, sintering to a polycrystalline state, converting to single crystal, and growing GaN/InGaN layers to form a hemi-spherical LED or LED array.

While there have been shown and described what are at present considered to be preferred embodiments of the invention, it will be apparent to those skilled in the art that various changes and modifications can be made herein without departing from the scope of the invention as defined by the appended claims.

What is claimed is:

1. A method for making a single-phase single crystal wavelength conversion element, the method comprising:
   obtaining a polycrystalline wavelength conversion element optionally containing a grain growth promoter by:
      combining a precursor material with an organic binder material and optionally a grain growth promoter to form a green state mixture;
      shaping the green state mixture to form a desired shape of the polycrystalline wavelength conversion element;
      heating the green state shape to remove the binder and form a pre-fired ceramic material; and
      sintering the pre-fired ceramic material to form the polycrystalline wavelength conversion element having the desired shape;
   attaching a seed crystal to a surface of the polycrystalline wavelength conversion element, wherein the seed crystal is attached by using the grain growth promoter at least when the polycrystalline wavelength conversion element does not contain the grain growth promoter; and
   sintering the polycrystalline wavelength conversion element at a temperature and for a time sufficient to form the single-phase single crystal wavelength conversion element.

2. The method of claim 1, wherein attaching the seed crystal to the surface of the polycrystalline wavelength conversion element comprises attaching a polished flat surface of the seed crystal to a polish flat surface of the polycrystalline wavelength conversion element.

3. The method of claim 1, wherein the single crystal wavelength conversion element comprises a garnet-based phosphor $(A_{1-x}Ce_x)_3B_5O_{12}$, wherein A is at least one of Y, Sc, La, Gd, Lu, or Tb, B is at least one of Al, Ga or Sc, and wherein x is from 0.005 to 0.1.

4. The method of claim 3, wherein x is from 0.005 to 0.05.

5. The method of claim 3, wherein x is from 0.005 to 0.02.

6. The method of claim 3, wherein the grain growth promoter is $SiO_2$.

7. The method of claim 1, wherein the single crystal wavelength conversion element comprises a phosphor selected from the group consisting of:
   (a) $(A_{1-x}Ce_x)_3(Al_{5-2y}Mg_ySi_y)O_{12}$ wherein A is at least one of Y, Lu, Tb, and Gd, $0.005 \leq x \leq 0.1$, and $0 < y \leq 2$;
   (b) $(A_{1-x}Ce_x)_3Al_{5-y}Si_yO_{12-y}N_y$ wherein A is at least one of Y, Lu, Tb, and Gd, $0.005 \leq x \leq 0.1$, and $0 < y \leq 0.5$;
   (c) $(A_{1-x}Ce_x)_2CaMg_2Si_3O_{12}$ wherein A is at least one of Y, Lu, Tb, and Gd, and $0 < x \leq 0.1$;
   (d) $(AE_{1-x}Eu_x)_2Si_5N_8$ wherein AE is at least one of Ca, Sr, and Ba and $0 < x \leq 0.1$;
   (e) $(AE_{1-x}Eu_x)AlSiN_3$ wherein AE is at least one of Ca, Sr, and Ba and $0 < x \leq 0.1$;
   (f) $(AE_{1-x}Eu_x)_3Ga_3N_5$ wherein AE is at least one of Ca, Sr, and Ba and $0 < x \leq 0.1$;
   (g) $(AE_{1-x}Eu_x)Si_2O_2N_2$ wherein AE is at least one of Ca, Sr, and Ba and $0 < x \leq 0.1$;
   (h) $(AE_xEu_y)Si_{12-2x-3y}Al_{2x+3y}O_yN_{16-y}$ wherein AE is at least one of Ca, Sr, and Ba, $0.2 < x \leq 2.2$ and $0 < y \leq 0.1$;
   (i) $(AE_{1-x}Eu_x)_2SiO_4$ wherein AE is at least one of Ca, Sr, and Ba and $0 < x \leq 0.1$;
   (j) $(AE_{1-x}Eu_x)_3SiO_5$ wherein AE is at least one of Ca, Sr, and Ba and $0 < x \leq 0.1$;
   (k) $(AE_{1-x}Eu_x)LiAl_3N_4$ wherein AE is at least one of Ca, Sr, and Ba and $0 < x \leq 0.1$; and
   (l) $(AE_{1-x}Eu_x)Mg_3SiN_4$ wherein AE is at least one of Ca, Sr, and Ba and $0 < x \leq 0.1$.

8. The method of claim 3, wherein the temperature is from 1700° C. to 1850° C.

9. The method of claim 8, wherein the time is from one hour to 48 hours.

10. The method of claim 1, wherein the method for making the single-phase single crystal wavelength conversion element is free of a Czochralski method.

11. The method of claim 1, wherein the seed crystal is a single crystal.

12. A method for making a single-phase single crystal wavelength conversion element, the method comprising:
   obtaining a polycrystalline wavelength conversion element by:
      combining a precursor material with an organic binder material and a grain growth promoter to form a green state mixture;
      shaping the green state mixture to form a desired shape of the polycrystalline wavelength conversion element;
      heating the green state shape to remove the binder and form a pre-fired ceramic material; and
      sintering the pre-fired ceramic material to form the polycrystalline wavelength conversion element having the desired shape;
   attaching a seed crystal to a surface of the polycrystalline wavelength conversion element; and
   sintering the polycrystalline wavelength conversion element at a temperature and for a time sufficient to form the single-phase single crystal wavelength conversion element.

13. A method for making a single-phase single crystal wavelength conversion element, the method comprising:
obtaining a polycrystalline wavelength conversion element by:
combining a precursor material with an organic binder material to form a green state mixture;
shaping the green state mixture to form a desired shape of the polycrystalline wavelength conversion element;
heating the green state shape to remove the binder and form a pre-fired ceramic material; and
sintering the pre-fired ceramic material to form the polycrystalline wavelength conversion element having the desired shape;
attaching a seed crystal to a surface of the polycrystalline wavelength conversion element, wherein the seed crystal is attached by using a grain growth promoter when the polycrystalline wavelength conversion element does not contain the grain growth promoter; and
sintering the polycrystalline wavelength conversion element at a temperature and for a time sufficient to form the single-phase single crystal wavelength conversion element.

\* \* \* \* \*